US006456214B1

(12) United States Patent
van der Wagt

(10) Patent No.: US 6,456,214 B1
(45) Date of Patent: Sep. 24, 2002

(54) HIGH-SPEED COMPARATOR UTILIZING RESONANT TUNNELING DIODES AND ASSOCIATED METHOD

(75) Inventor: J. Paul A. van der Wagt, Newbury Park, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/670,765

(22) Filed: Sep. 27, 2000

(51) Int. Cl.[7] .............................................. H03M 1/12

(52) U.S. Cl. ...................... 341/133; 341/155; 327/195

(58) Field of Search ............................... 341/133, 155; 327/195, 196, 77

(56) References Cited

U.S. PATENT DOCUMENTS

| | | | |
|---|---|---|---|
| 3,021,517 A | * 2/1962 | Kaenel et al. ............... 341/133 |
| 3,176,152 A | * 3/1965 | Spiegel ........................ 341/133 |
| 4,990,799 A | 2/1991 | Weiss .......................... 307/355 |
| 5,140,188 A | 8/1992 | Burns .......................... 307/362 |
| 5,510,734 A | 4/1996 | Sone ............................ 324/65 |
| 6,100,723 A | 8/2000 | Broekaert .................... 327/77 |
| 6,118,316 A | 9/2000 | Tamamura et al. ......... 327/156 |
| 6,157,220 A | * 12/2000 | Broekaert .................... 327/65 |
| 6,208,277 B1 | * 3/2001 | Hellums et al. ............. 341/133 |

FOREIGN PATENT DOCUMENTS

JP          10-092188       *   4/1998

OTHER PUBLICATIONS

A. Seabaugh et al., "Resonant Tunneling Circuit Technology: Has It Arrived?", GaAs IC Symposium, IEEE Gallium Arsenide Integrated Circuit Symposium, Technical Digest 1997, pp. 119–122 (Mar. 1997).

E. Goto et al., "Esaki Diode High–Speed Logical Circuits", IRE Transactions on Electronic Computers, pp. 25–29 (Mar. 1960).

A. Seabaugh et al., "Tunnel Diodes", Encyclopedia of Applied Physics, vol. 22, pp. 335–359 (Sep. 1998).

Tom Broekaert et al., "A Monolithic 4–Bit 2–Gsps Resonant Tunneling Analog–to–Digital Converter", IEEE Journal of Solid–State Circuits, vol. 33, No. 9, pp. 1342–1349 (Oct. 1998).

B. Brar et al., "3 GHz Resonant Tunneling Clocked Comparator" IEEE Cornell Conference Adv. Concepts High Speed Semiconductor, Devices Circuits, pp. 28–34 (Mar. 1997).

* cited by examiner

*Primary Examiner*—Howard L. Williams
(74) *Attorney, Agent, or Firm*—O'Keefe, Egan & Peterman, LLP; René E. Grossman

(57) ABSTRACT

A high-speed comparator and an associated method are disclosed. The comparator utilizes input circuitry to receive the input signal and utilizes resonant tunneling diode (RTD) circuitry to provide a high or low level determination. The RTD circuitry may be made weak compared to the input circuitry to eliminate hysteresis, and the comparators may be cascaded together to provide a positive-gain. In addition, clocked switches may be added to the cascaded comparator circuitry to create a clocked quantizer for analog to digital conversion. If desired, the RTD circuitry may include two RTDs connected to the output signal, and the input circuitry may include a transistor connected as a source-follower and transistor connected as a current sink.

30 Claims, 7 Drawing Sheets

HIGH-SPEED COMPARATOR UTILIZING RESONANT TUNNELING DIODES AND ASSOCIATED METHOD

TECHNICAL FIELD OF THE INVENTION

The present invention relates to converting analog information to digital information. More particularly, the present invention relates to high-speed comparators that will provide a low level or a high level indication based upon an input signal level.

BACKGROUND

Analog to digital conversions are often implemented using quantizers that sample the input analog signal and output a high or low voltage depending upon the signal level of the input signal. Quantizers for analog to digital conversions with high frequency input signals must be capable of making decisions quickly and reliably. These high input frequencies and associated high frequency sampling signals create significant problems in achieving these goals of speed and reliability.

Conventional quantizers rely upon inverter circuits to provide a positive-gain high or low level decision. The performance of such typical inverter circuits, however, suffer at high-frequencies, for example, at frequencies above about 1 GHz.

SUMMARY OF THE INVENTION

In accordance with the present invention, circuitry and an associated method are disclosed that provide a high-speed comparator. The comparator of the present invention utilizes input circuitry to receive the input signal and resonant tunneling diode (RTD) circuitry to provide the high or low level determination. The RTD circuitry may be made weak compared to the input circuitry to eliminate hysteresis, and the comparators may be cascaded together to provide a large positive-gain. In addition, clocked switches may be added to the cascaded comparator circuitry to create a clocked quantizer for analog to digital conversion.

In one embodiment, the present invention is a comparator including input circuitry having an input signal node, a reference signal node, and an output signal node, and resonant tunneling diode circuitry coupled to the output signal node. The input circuitry and the resonant tunneling diode circuitry work together to provide at the output signal node a stable low voltage point and a stable high voltage point depending upon the level of the input signal applied to the input signal node. In a further embodiment, the resonant tunneling diode circuitry has a weaker current level than the current level for the input circuitry. Still further, the current level for the resonant tunneling diode circuitry is at least about 10 times less than the current level for the input circuitry.

In more detailed respects, the resonant tunneling diode circuitry may include a pair of resonant tunneling diodes. In another more detailed embodiment, the input circuitry includes a first MOS transistor connected in a source-follower configuration with a gate of the first MOS transistor being coupled to the input signal node, and a second MOS transistor connected as a current sink with a gate node of the second MOS transistor being coupled to the reference voltage node.

In a further embodiment, the present invention is comparator circuitry including a plurality of the above comparators cascaded together such that the output signal node of a previous comparator is connected to the input signal node of the next comparator.

In a still further embodiment, the present invention is a clocked quantizer including an input signal node, an output signal node, the above cascaded comparator circuitry, and a switch coupled between the input signal node and the cascaded comparator circuitry to control when the clocked quantizer samples a signal applied to the input signal node. The switch is controlled by a clock signal. In addition, the clocked quantizer may include a second switch coupled between the output and the input of the comparator circuit to control when the output signal at the output signal node is latched. The second switch is controlled by a second clock signal. Still further, in the clocked quantizer may include a second comparator circuit coupled between the switch and the input signal node.

In another respect, the present invention is a method for providing a low level or a high level indication based upon the level on an input signal. This method includes receiving an input signal, driving the input signal with input circuitry to produce an output signal, and utilizing resonant tunneling diode circuitry to produce for the output signal a stable low voltage point or a stable high voltage point depending upon the level of the input signal. In a more detailed embodiment, the resonant tunneling diode circuitry has a weaker current level than the current level for the input circuitry so that hysteresis is reduced or eliminated. In addition, the resonant tunneling diode circuitry may include a first resonant tunneling diode coupled between the output signal node and a first voltage node and a second resonant tunneling diode coupled between the output signal node and a second voltage node.

In another embodiment, the method of the present invention may include repeating the driving and utilizing steps a plurality of times by cascading together a plurality of comparators, with each comparator including input circuitry and resonant tunneling diode circuitry. The method may also include providing an overall gain that is much greater than one. Finally, after the receiving step, the method may include controlling when the input signal is provided to the plurality of comparators so that the input signal is sampled at a desired rate.

DESCRIPTION OF THE DRAWINGS

It is noted that the appended drawings illustrate only exemplary embodiments of the invention and are, therefore, not to be considered limiting of the scope of the invention, for the invention may admit to other equally effective embodiments.

DETAILED DESCRIPTION OF THE INVENTION

The present invention provides a high-speed comparator and an associated method that overcomes problems with prior art implementations. In general, the comparator utilizes input circuitry to receive the input signal and utilizes resonant tunneling diode (RTD) circuitry to provide a high or low level determination.

Figure 1:
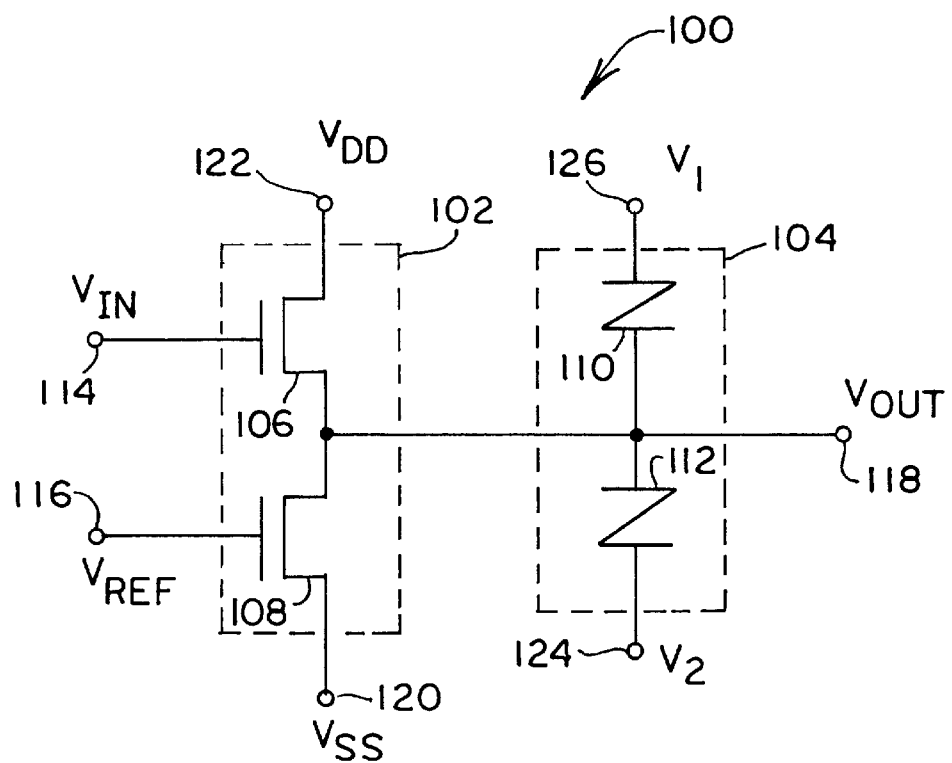
FIG. 1 is a circuit diagram for an embodiment of a high-speed comparator utilizing resonant tunneling diodes (RTDs) according to the present invention.

FIG. 1 is a circuit diagram for an embodiment of a high-speed comparator 100 utilizing resonant tunneling diodes (RTDs) 110 and 112 according to the present invention. The comparator 100 includes input circuitry 102 and RTD circuitry 104. In the embodiment depicted in FIG. 1, the input circuitry 102 includes transistors 106 and 108, and the RTD circuitry 104 includes RTDs 110 and 112. The transistor 106 is connected as a source-follower with its drain connected to voltage source node ($V_{DD}$) 122 and its gate connected to the input voltage node ($V_{IN}$) 114. The source of transistor 106 is connected to the voltage output node ($V_{OUT}$) 118. The transistor 108 is connected as a current sink with its drain connected to the source of transistor 106, its gate connected to a reference voltage node ($V_{REF}$) 116, and its source connected to the low supply voltage node ($V_{SS}$) 120. The transistors 106 and 108 may be n-channel MOSFETs (Metal Oxide Semiconductor Field Effect Transistor) or compound semiconductor FETs or any other transistor structure desired that will provide for the operational features discussed below. RTD 110 is connected between a first voltage node ($V_1$) 126 and the voltage output node ($V_{OUT}$) 118. RTD 112 is connected between a second voltage node ($V_2$) 124 and the voltage output node ($V_{OUT}$) 118. It is noted that RTDs and their device characteristics are known, for example, as described in U.S. Pat. No. 5,140,188, which is hereby incorporated by reference in its entirety. It is also noted that the input circuitry 102 could be implemented with p-channel FETs or with bipolar devices, for example, by forming an emitter follower circuit and a current sink with bipolar transistors.

The voltages provided at voltage nodes 116, 120, 122, 124 and 126 may be adjusted as desired. They may be, for example, a voltage of 1.6 volts applied to voltage source node ($V_{DD}$) 122, a voltage of −1.0 volts applied to low supply voltage node ($V_{SS}$) 120, a voltage of 0.6 volts applied to first voltage node ($V_1$) 126, and a voltage of 0.0 volts applied to second voltage node ($V_2$) 124. The reference voltage node ($V_{REF}$) 108 may be connected to the low supply voltage node ($V_{SS}$) 120 so that transistor 108 acts as a resistive element. It is also noted that the voltage source ($V_{DD}$) and the low supply voltage ($V_{SS}$) 120 may be auxiliary or regulated voltages, as desired.

Figure 2:
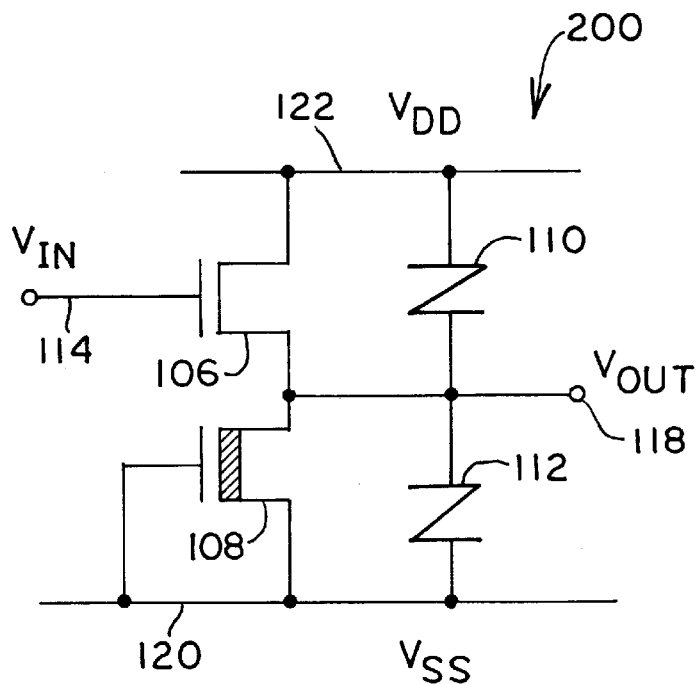
FIG. 2 is a circuit diagram for an alternative configuration for the high-speed comparator of FIG. 1.

FIG. 2 is a circuit diagram for an alternative configuration for a high-speed comparator 200. As with the comparator 100, the comparator 200 of FIG. 2 includes transistors 106 and 108 and RTDs 110 and 112. However, the RTD 110 is connected to the voltage source node ($V_{DD}$) 122, and the RTD 112 is connected to the low supply voltage node ($V_{SS}$) 120. In addition, the transistor 108 is shown in FIG. 2 as a depletion mode transistor and has its gate connected to the low supply voltage node ($V_{SS}$) 120. Thus, the configuration depicted in FIG. 2 provides for a simplified connection scheme. In addition, if the transistor 106 is a depletion mode transistor of similar size and characteristics as transistor 108, the output level $V_{OUT}$ would nominally be equal to the input level $V_{IN}$, if RTD action is ignored. This configuration provides additional symmetry which is useful when cascading several such comparators.

As opposed to inverter circuitry, the performance of the comparators 100 and 200 are not hindered by parasitic capacitances between the gate and source nodes of the input transistor. This capacitance is normally for greater than the gate-to-drain capacitance. Any parasitic gate-to-source capacitance tends to make the source voltage move in the same direction as the gate voltage is moving. In the comparators 100 and 200, this result is actually desirable. With inverter circuitry, the goal is to have the output move in the opposite direction as the input. Thus, this dominant parasitic capacitance is a disadvantage in inverter based comparators. As a result, the speed of this comparator is not limited by the transistor unity current gain cut-off frequency, $f_T$, in contrast to inverter based comparators.

Figure 3:
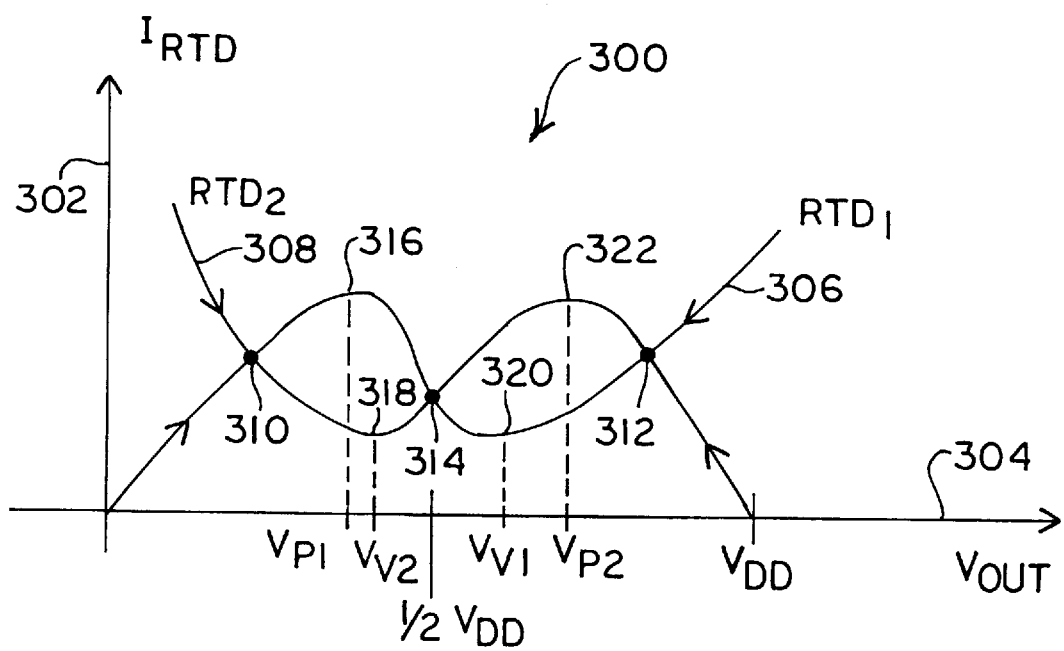
FIG. 3 is a load-line diagram representing the voltage versus current characteristics of the two RTDs in FIG. 1 and FIG. 2.

FIG. 3 is a load-line diagram 300 representing the voltage versus current characteristics of the two RTDs 110 and 112 in FIG. 1 and FIG. 2. This load-line diagram 300 represents the characteristics of the two RTDs without considering the effect of the input circuitry 102. The x-axis 304 represents the output voltage at the voltage output node ($V_{OUT}$) 118. The y-axis 302 represents the current ($I_{RTD}$) passing through the RTDs. Line ($RTD_1$) 306 represents the characteristics of RTD 110 with peak point ($V_{P1}$) 316 and the valley point ($V_{V1}$) 320 being indicated on line 308. Line 308 ($RTD_2$) represents the characteristics of RTD 112 with peak point ($V_{P2}$) 322 and the valley point ($V_{V2}$) 318 being indicated on line 308. The two RTDs 110 and 112 form what is known as a "Goto" pair as described in the article Goto, et al., "Esaki Diode High-Speed Logical Circuits," *IRE Trans. Electronic Comp.*, vol. 9, pp. 25–29 (1960), which is hereby incorporated by reference in its entirety.

As the voltage on the voltage output node ($V_{OUT}$) 118 moves up and down, the voltage-current state of the RTD pair will tend to move to one of the two points 310 and 312 where the lines 306 and 308 cross. Point 310 may reside close to ¼ $V_{DD}$. Point 312 may reside close to ¾ $V_{DD}$. And point 314 in general will reside extremely close to ½ $V_{DD}$. In operation, only points 310 and 312 are stable. As shown by the arrows on lines 306 and 308, as the voltage goes below ¼ $V_{DD}$, RTD 110 and RTD 112 attempt to move the current back to the stable point 310. As also shown by the arrows on lines 306 and 308, as the voltage goes above ¾ $V_{DD}$, RTD 110 and RTD 112 attempt to move the current back to the stable point 312. Although point 314 is also located at a crossing point, it is only a quasi-stable point, such that any movement in the voltage either way will tend to quickly move the current to the stable points of 310 or 312, respectively. Thus, the RTDs 110 and 112 provide a comparator type function providing a low level and a high level stable points for the voltage on the voltage output node ($V_{OUT}$) 118.

Figure 4:
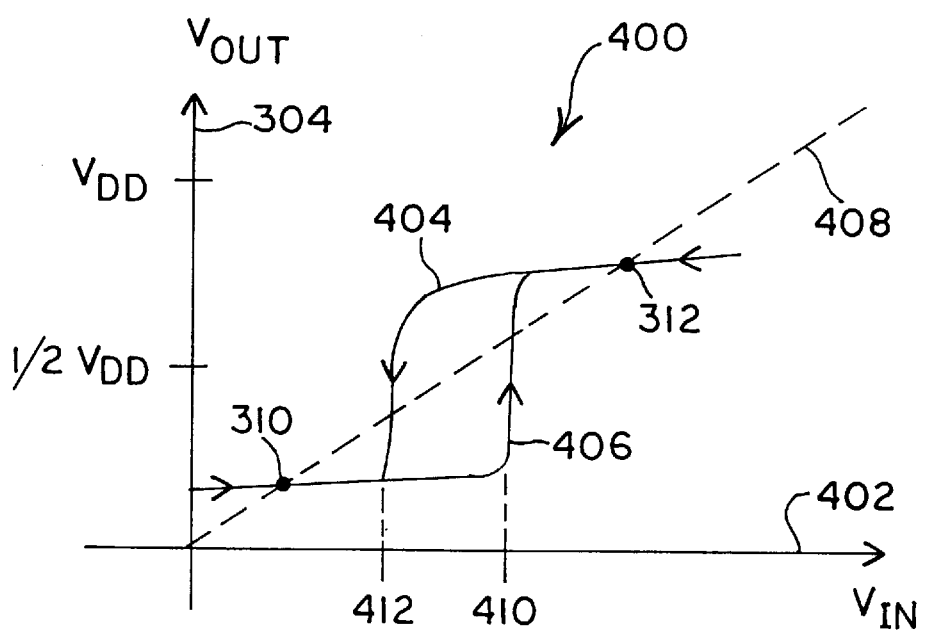
FIG. 4 is a diagram representing the output voltage versus the input voltage for the circuitry of FIG. 1 and FIG. 2.

FIG. 4 is a diagram 400 representing the output voltage versus the input voltage for the circuitry of FIG. 1 and FIG.

2 and takes into consideration the effect of the input circuitry 102. The x-axis 402 represents the voltage on the input voltage node ($V_{IN}$) 114. The y-axis 304 represents the voltage on the output voltage node ($V_{OUT}$) 118. The dotted diagonal line 408 represents the response for the input circuitry 102, if the RTD circuitry 104 were not present. This line tends to always have a gain (slope) of less than one, although it can come quite close to one. The points 310 and 312 represent the stable output voltage points discussed with respect to FIG. 3 above. As the input voltage rises from zero, the RTD circuitry 104 attempts to move the output voltage to stable point 310. At a trigger point 410 along curve 406, the RTD circuitry 104 will transition and attempt to move the voltage to stable point 312. As the input voltage continues to rise, the RTD circuitry 104 will attempt to keep the output at stable point 312. If the input voltage falls, the RTD circuitry 104 will still attempt to keep the output voltage at stable point 312 until a trigger point 412 along curve 404 is reached. At that point, the RTD circuitry 104 will transition and attempt to move the voltage back to stable point 310.

The difference between the low-to-high trigger point 410 and the high-to-low trigger point 412 indicates that the circuitry 100 or 200 may have hysteresis. Hysteresis refers to the fact that the operation of the circuitry depends on its previous state. This is typically an undesirable property for comparators. Thus, it is desirable to eliminate this hysteresis by getting the low-to-high trigger point 410 and the high-to-low trigger point 412 to be substantially the same.

Figure 5:
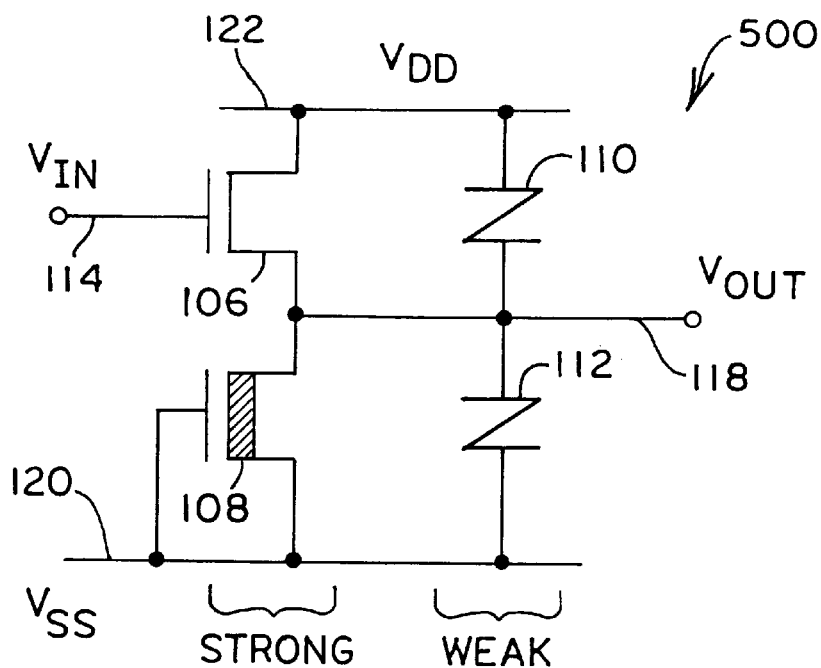
FIG. 5 is a circuit diagram for a configuration for the circuitry of FIG. 1 and FIG. 2 to improve circuit response for use as a comparator.

FIG. 5 is a circuit diagram for a configuration 500 for the comparator 200 of FIG. 2 to improve circuit response for use as a comparator by reducing hysteresis. As shown in FIG. 5, the RTDs 110 and 112 are made weak compared to the strong transistors 106 and 108. By weakening the RTDs 110 and 112, they become less able to control the operation of the comparator, and the hysteresis effect shown in FIG. 4 is greatly reduced. It is noted that this technique is also applicable to other embodiments, such as comparator 100 depicted in FIG. 1.

Figure 6:
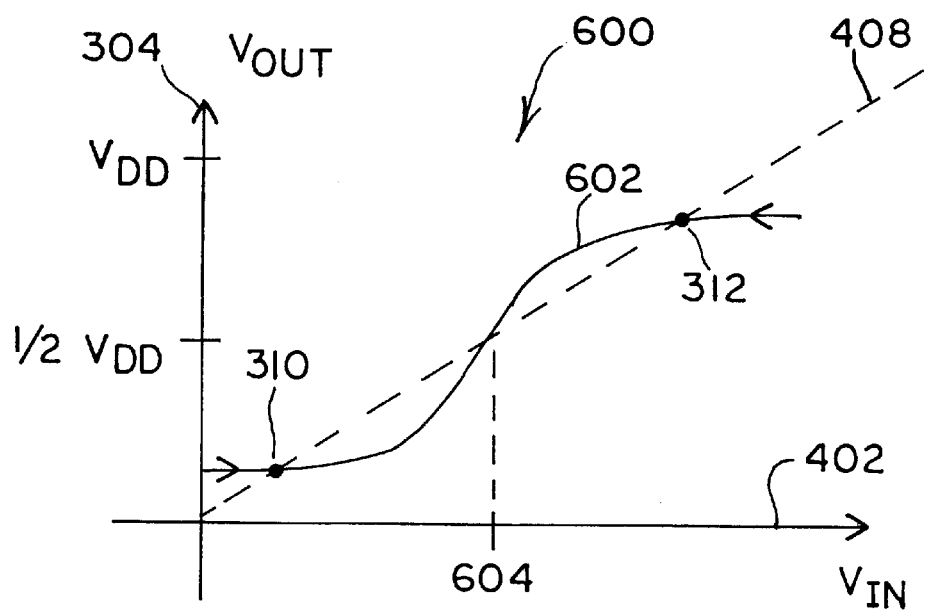
FIG. 6 is a diagram representing the output voltage versus the input voltage for the circuitry of FIG. 5.

FIG. 6 is a diagram 600 representing the output voltage versus the input voltage for the comparator 500 of FIG. 5. As with FIG. 4, the x-axis 402 represents the voltage on the input voltage node ($V_{IN}$) 114, and the y-axis 304 represents the voltage on the output voltage node ($V_{OUT}$) 118. Also, the dotted diagonal line 408 again represents the response for the input circuitry 102 if the RTD circuitry 104 were not present. As mentioned before, this line has a slope of less than one, since source-follower circuits cannot exhibit gain. The points 310 and 312 again represent the stable output voltage points discussed with respect to FIG. 3 above. The difference is that the window created between curves 404 and 406 in FIG. 4 has been removed and a single curve 602 is depicted instead. The trigger point 604 is effective for both the low-to-high transition and the high-to-low transition. The resulting curve can exhibit gain larger than one around the center point and thus provide a comparator function. Without a positive gain, the comparator circuitry would tend to decrease the amount of information available from the input signal, in effect flattening out the input signal information.

This weakening of the RTDs, therefore, provides a significantly improved result for use as of the circuitry 500 as a comparator. A typical transistor, for example, may operate at currents around 1–100 milli-amps (ma). A typical RTD may have a current of about the same magnitude at the voltage peak point, such as points ($V_{P1}$ and $V_{P2}$) 316 and 322 in FIG. 3. According to the present invention as shown in FIG. 5, the RTDs are desired to be weakened with respect to the transistors. To weaken an RTD, the peak current could be decreased, for example, by about tenfold or lower compared to the current passing through the transistors. This weakening can be accomplished by making the RTDs smaller or the transistors larger. The important result is that the transistors become relatively stronger and that the RTDs become relatively weaker. Conceptually, it is as if the current scale for the RTDs is collapsed as compared to the current scale for the transistors. The result of this change in relative strengths of the RTDs and the transistors is that the hysteresis tends to disappear as indicated in FIG. 6, leaving a smooth curve rather than a discontinuous jump and a hysteresis window as in FIG. 4. In other words, this adjustment to the relative strength of the RTDs and transistors tends to eliminate the snap associated with the changing voltage levels at the output voltage node. Advantageously, therefore, by weakening the RTDs, the RTDs are retained in the circuitry, providing an overall circuit gain larger than one, and yet the hysteresis window is removed.

To summarize, source-follower circuits are much faster than inverter based circuits, but never have a gain larger than one. By adding weak RTDs to the source-follower configuration, a gain larger than one is obtained at almost no cost in terms of speed. This is so because RTDs are inherently extremely fast devices relative to existing transistor technology. The following article, which is hereby incorporated by reference in its entirety, describes RTD-FET circuit integration: Seabaugh, A., et. al., "Resonant Tunneling Circuit Technology: Has it Arrived?," GaAs IC Symposium (October 1997) (IEEE 0-7803-4083-3/97).

One additional problem, however, is that a still larger positive gain is desirable for the circuitry of the present invention to be even more effective as a comparator.

Figure 7:
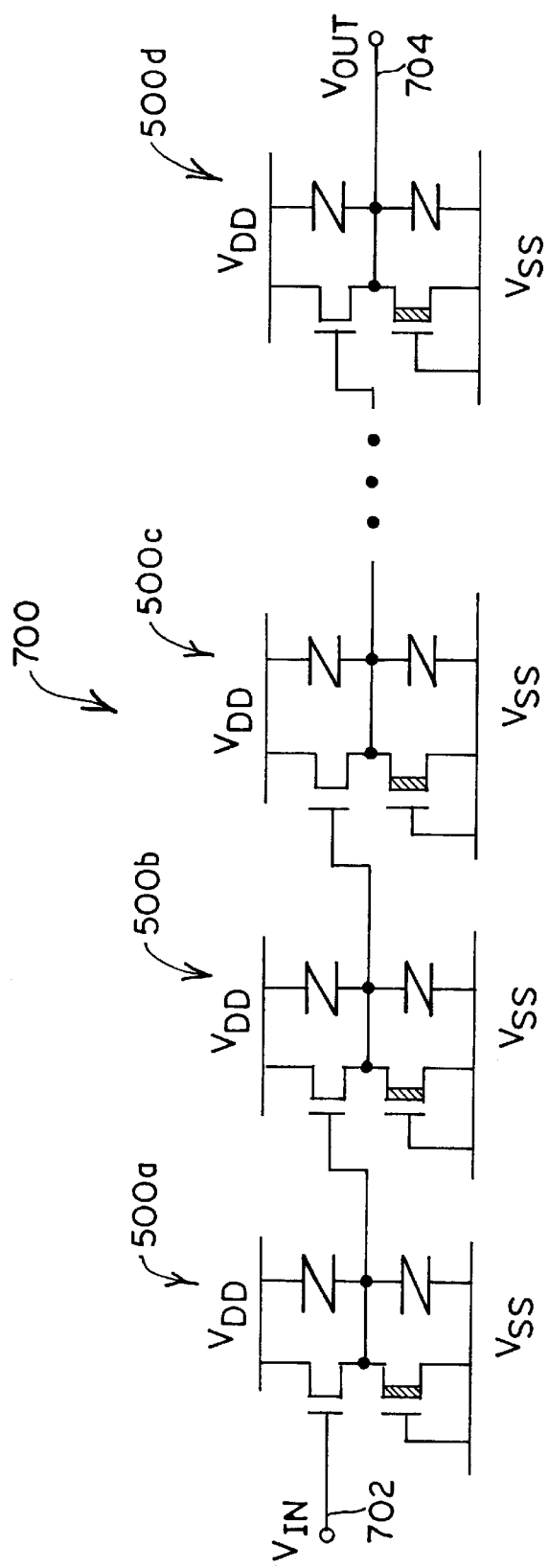
FIG. 7 is a circuit diagram for comparator circuitry made from a series of cascaded comparator circuits according to the present invention.

FIG. 7 provides a solution to this problem and creates a large positive gain by cascading a plurality of comparators 500 together. FIG. 7 depicts comparator circuitry 700 having comparators 500a, 500b, 500c. . . 500d cascaded together with the output voltage node of the previous comparator being connected to the input voltage node of the next comparator. The input signal is applied to input node ($V_{IN}$) 702, and the output signal is provided at the output node ($V_{OUT}$) 704. The resulting comparator circuitry 700 advantageously provides a high-speed positive-gain comparator. The number of comparators 500 to cascade together may be selected depending upon the response desired. Care may also be taken to make the average input and output voltage levels of each comparator about the same. This may be achieved, for example, by using identical depletion-mode transistors 106 and 108 in FIG. 2.

Figure 8:
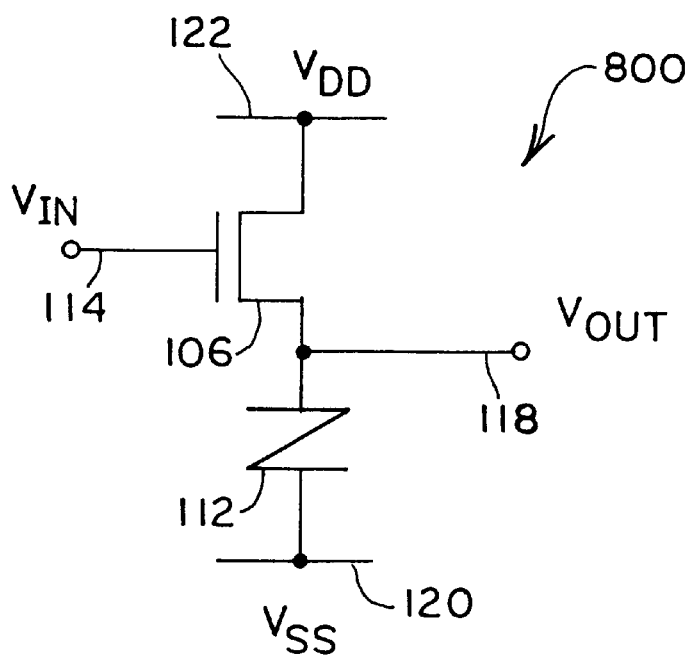
FIG. 8 is a circuit diagram for an alternative embodiment for the high-speed comparator according to the present invention.

FIG. 8 is a circuit diagram for an alternative embodiment for a high-speed comparator 800 according to the present invention. The input circuitry 102 and the RTD circuitry of 104 may be simplified if circuitry symmetry is not desired. This is shown in FIG. 8 with the input circuitry being reduced to transistor 106, and the RTD circuitry being reduced to RTD 112. The transistor 106 is again connected as a source-follower with its drain connected to voltage source node ($V_{DD}$) 122, its gate connected to the input voltage node ($V_{IN}$) 114, and its source connected to the voltage output node ($V_{OUT}$) 118. RTD 112 is connected between the voltage output node ($V_{OUT}$) 118 and the low supply voltage node ($V_{SS}$) 120.

Figure 9:
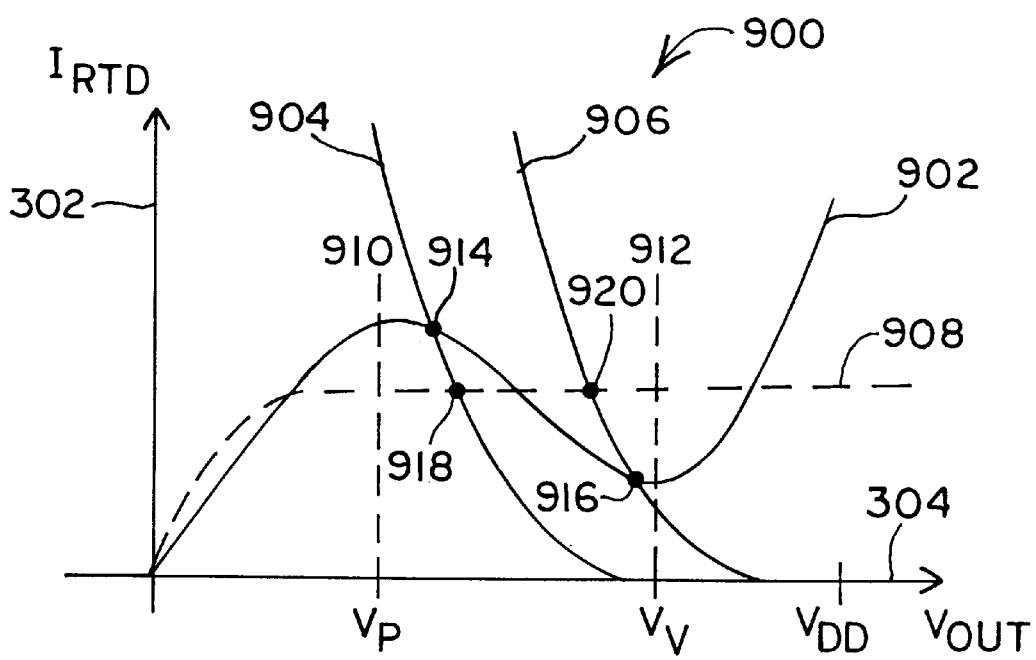
FIG. 9 is a load-line diagram representing the voltage versus current characteristics of the circuitry of FIG. 8.

FIG. 9 is a load-line diagram 900 representing the voltage versus current characteristics of the comparator 800 of FIG. 8. This load-line diagram 900 represents the characteristics of the RTD 112 while considering the effect of the transistor

106 through its common-gate characteristics for a given $V_{IN}$ and $V_{DD}$. The x-axis 304 represents the output voltage at the voltage output node ($V_{OUT}$) 118. The y-axis 302 represents the current ($I_{RTD}$) passing through the RTD 112 and the current ($I_{FET}$) through the transistor 106. Line 902 represents the characteristics of the RTD 112 with peak point ($V_P$) 910 and valley point ($V_V$) 912 being indicated on line 902. Lines 904 and 906 represent the common-gate characteristics of transistor 106 for two different input voltages, $V_{IN1}$, and $V_{IN2}$, where $V_{IN2}$ is larger than $V_{IN1}$. In addition, line 908 shows the characteristic of a transistor current sink, such as transistor 108 in FIG. 1, that would be present in a regular source follower, such as 102 in FIG. 1.

For the source follower circuit 102 with no RTDs, the output voltage is given by point 918 for input voltage $V_{IN}$, (curve 904) and by point 920 for input voltage $V_{IN2}$ (curve 906). The difference in output voltages is nearly equal to $V_{IN2}-V_{IN1}$, since curves 904 and 906 are shifted horizontally by approximately this amount. This yields a gain slightly below one for the source follower circuit, as mentioned above.

For the circuit 800, in FIG. 8, the transistor current sink with characteristic 908 in FIG. 9 is replaced by an RTD 112 with characteristic 902 in FIG. 9. As a result, the output voltage is now given by point 914 for input voltage $V_{IN1}$, (curve 904) and by point 916 for input voltage $V_{IN2}$ (curve 906). It can be seen in FIG. 9 that the difference in output voltages is larger than in the case of the regular source follower circuit. Because the regular source follower circuit may have a gain of nearly one, the output voltage difference may become larger than the input voltage difference, $V_{IN2}-V_{IN1}$. This constitutes a gain larger than one for the circuit in FIG. 8. If the negative slope of the RTD characteristic 902 becomes larger in absolute value than the magnitude of the slopes of the transistor common gate characteristics 904 and 906, a hysteresis effect, or history dependence, may occur for the output voltage $V_{OUT}$. Thus, again, the RTD is preferably not strong in terms of its negative differential resistance value.

Figure 10:
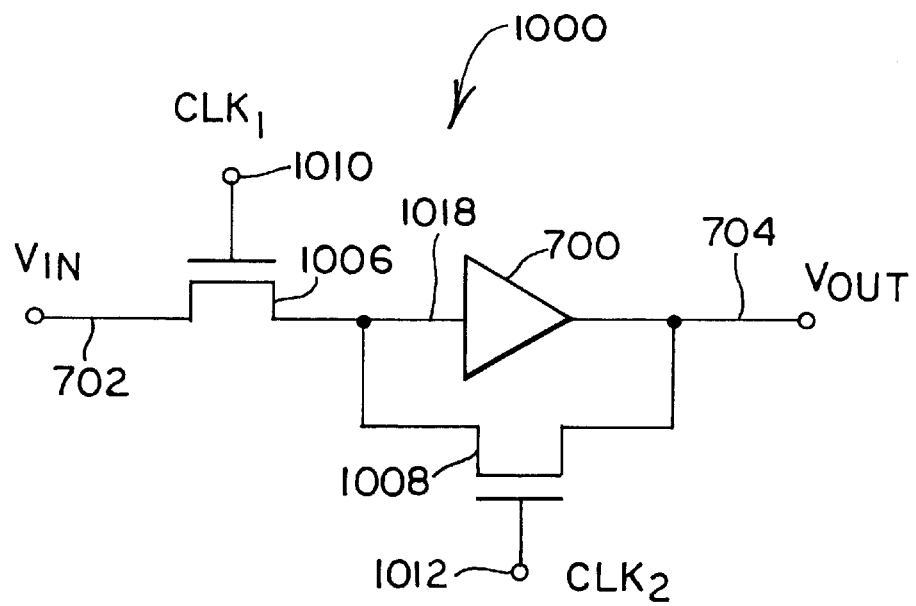
FIG. 10 is a block diagram for an embodiment of a clocked quantizer utilizing cascaded high-speed comparators according to the present invention.

FIG. 10 is a block diagram for an embodiment of a clocked quantizer 1000 utilizing the cascaded comparator circuitry 700 of FIG. 7. The input of the cascaded comparator circuitry 700 is connected to internal node 1018, and the output of the cascaded comparator circuitry 700 is connected to the output node ($V_{OUT}$) 704. A clocked switch, which may be transistor 1006, is placed between the input node ($V_{IN}$) 702 and the internal node 1018. The transistor 1006 is controlled by a first clock signal (CLK$_1$) applied to the first clock signal node 1010. This transistor 1006 allows the input signal applied to the input node ($V_{IN}$) 702 to be sampled at a desired frequency dependent upon the frequency selected for the first clock signal (CLK$_1$). A second clocked switch, which may be transistor 1008, is placed between the output node ($V_{OUT}$) 704 and the internal node 1018. The transistor 1008 is controlled by a second clock signal (CLK$_2$) applied to the second clock signal node 1012. This transistor 1008 acts to latch the output of the cascaded comparator circuitry 700 when it is in its closed state. The two clock signals (CLK$_2$ and CLK$_2$) may be selected as desired and may be, for example, inverses of each other so that when one is high, the other is low.

Figure 11:
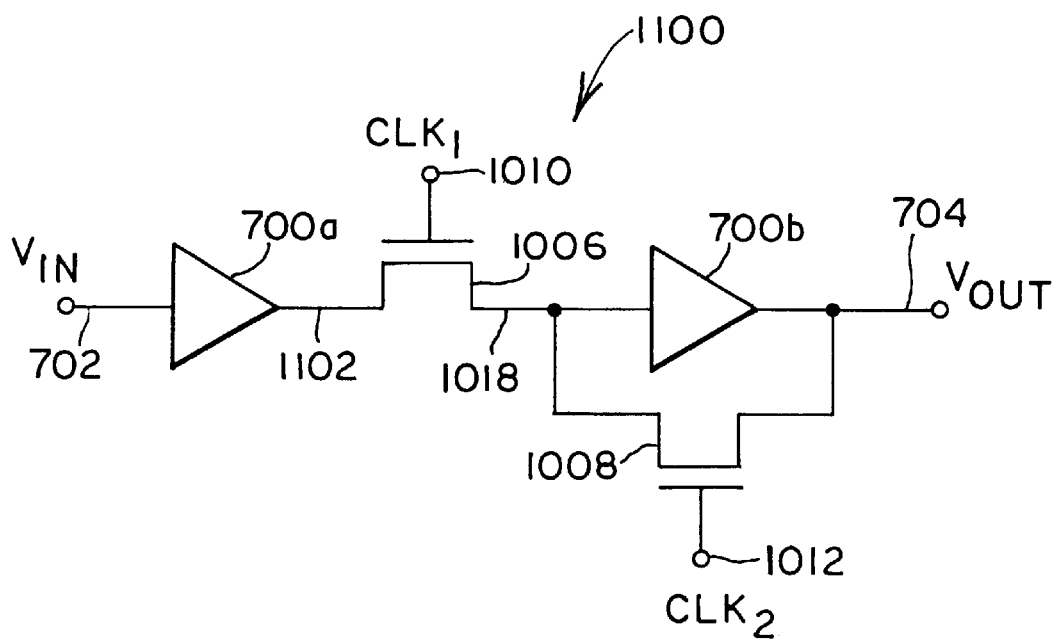
FIG. 11 is a block diagram for an alternative embodiment of a clocked quantizer utilizing high-speed comparators according to the present invention.

FIG. 11 is a block diagram for an alternative embodiment of a clocked quantizer 1100 utilizing the cascaded comparator circuitry 700 according to the present invention. The clocked quantizer 1100 is similar to the clocked quantizer 1000 of FIG. 10 except that a second cascaded comparator circuit is utilized. The cascaded comparator circuitry 700b matches the cascaded comparator circuitry 700 in FIG. 10. In FIG. 11, a cascaded comparator circuitry 700a has been added between the input node ($V_{IN}$) 702 and the first switch, which may again be transistor 1006. The output of the cascaded comparator circuitry 700a is node 1102. It is noted that in the clocked quantizers 1000 and 1100 of FIGS. 10 and 11, the cascaded comparator circuitry 700, 700a and 700b may include any desired number of comparators 500 cascaded together.

Figure 12:
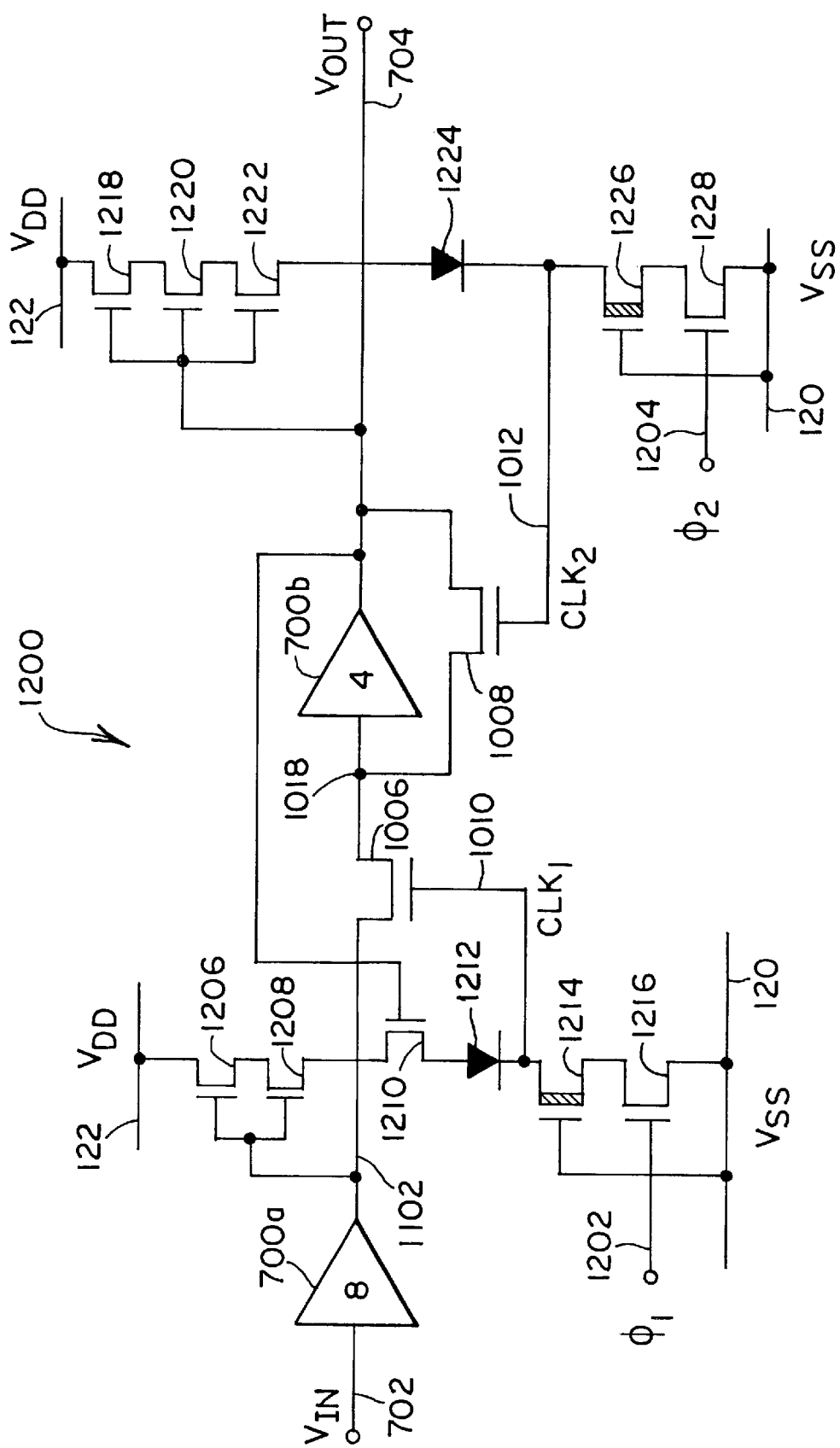
FIG. 12 is a circuit diagram for the embodiment of the clocked quantizer of FIG. 11.

FIG. 12 is a circuit diagram for a more detailed embodiment 1200 of the clocked quantizer 1100 of FIG. 11 including more circuitry associated with the control of the first and second clock signals (CLK$_1$ and CLK$_2$). In the clocked quantizer 1200, eight (8) cascaded comparators 500 have been selected for the cascaded comparator circuitry 700a, and four (4) cascaded comparators 500 have been selected for the cascaded comparator circuitry 700b. Simulations with models for 150 GHz-$f_T$ HFETs (heterojunction FETs) and high-speed RTDs in an indium phosphide (InP) based material system indicate about 7.5 bits of quantizer linearity at clock frequency of 10 GHz and input signal frequency around 1 GHz. As mentioned and incorporated by reference above, the following article describes RTD-FET circuit integration: Seabaugh, A., et. al., "Resonant Tunneling Circuit Technology: Has it Arrived?," GaAs IC Symposium (October 1997) (EEEE 0-7803-4083-3/97).

The control circuitry for the first clock signal (CLK$_1$) applied to the first clock signal node (CLK$_1$) 1010 includes transistors 1206, 1208, 1210, 1214 and 1216, as well as diode 1212. The transistors 1206 and 1208 are connected between the supply voltage ($V_{DD}$) 122 and the diode 1212, with their gates being connected to the node 1102. Transistor 1210 is connected between transistor 1208 and diode 1212 with its gate connected to the output of cascaded comparator circuitry 700b. The transistors 1214 and 1216 are connected between diode 1212 and the low supply voltage ($V_{SS}$) 120. The transistor 1214 is a depletion mode transistor and has its gate connected to the low supply voltage ($V_{SS}$) 120. The gate of transistor 1216 is connected to a first clock control signal ($\phi_1$) 1202. The first clock node (CLK$_1$) 1010 is taken from the node between the diode 1212 and the transistor 1214. It is noted that the transistors 1206, 1208, 1210, 1214 and 1216 may be n-channel MOSFETs or compound semiconductor FETs.

The control circuitry for the second clock signal (CLK$_2$) applied to the second clock signal node (CLK$_2$) 1008 includes transistors 1218, 1220, 1222, 1226 and 1228, as well as diode 1224. The transistors 1218, 1220 and 1222 are connected between the supply voltage ($V_{DD}$) 122 and the diode 1224, with their gates being connected to the output node ($V_{OUT}$) 704. The transistors 1226 and 1228 are connected between diode 1224 and the low supply voltage ($V_{SS}$) 120. The transistor 1226 is a depletion mode transistor and has its gate connected to the low supply voltage ($V_{SS}$) 120. The gate of transistor 1228 is connected to a second clock control signal ($\phi_2$) 1204. The second clock node (CLK$_2$) 1012 is taken from the node between the diode 1224 and the transistor 1226. It is noted that the transistors 1218, 1220, 1222, 1226 and 1228 may be n-channel MOSFETs or compound semiconductor FETs.

It is noted that the above description has been provided with respect to embodiments that use n-channel compound semiconductor FETs in an integrated HFET-RTD process technology or use n-channel MOSFETs in NMOS designs. Other embodiments could also be created using p-channel MOSFETs in PMOS designs, mixed n-channel and p-channel MOSFETs, bipolar transistors, or any other transistor configuration that would provide the features discussed above.

Further modifications and alternative embodiments of this invention would also be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements or materials may be substituted for those illustrated and described herein, and certain features of the invention may be utilized independently of the use of other features, all as would be apparent to one skilled in the art after having the benefit of this description of the invention.

I claim:

1. A comparator, comprising:
   input circuitry having an input signal node, a reference signal node, and an output signal node; and
   resonant tunneling diode circuitry coupled to the output signal node; the resonant tunneling diode circuitry comprises:
      a first resonant tunneling diode coupled between the output signal node and a first voltage node; and
      a second resonant tunneling diode coupled between the output signal node and a second voltage node;
   wherein the input circuitry and the resonant tunneling diode circuitry provide at the output signal node a stable low voltage point and a stable high voltage point depending upon the level of the input signal applied to the input signal node.

2. The comparator of claim 1, wherein the resonant tunneling diode circuitry has a weaker current level than the current level for the input circuitry.

3. The comparator circuitry of claim 2, wherein the input circuitry provides an output signal at the output signal node that follows an input signal received at the input signal node.

4. The comparator of claim 3, wherein the input circuitry comprises:
   a first transistor connected in a source-follower configuration with a gate of the first transistor being coupled to the input signal node; and
   a second transistor connected as a current sink with a gate node of the second transistor being coupled to the reference voltage node.

5. The comparator of claim 1, wherein the first and second resonant tunneling diodes have a weaker current level than the current level for the input circuitry so that hysteresis is reduced.

6. The comparator of claim 5, wherein the current level for the resonant tunneling diode circuitry is at least about 10 times less than the current level for the input circuitry.

7. The comparator of claim 6, further comprising:
   a first transistor connected in a source-follower configuration with a gate of the first transistor being coupled to the input signal node; and
   a second transistor connected as a current sink with a gate node of the second transistor being coupled to the reference voltage node.

8. The comparator of claim 7, wherein the drain of the first transistor is coupled to the first voltage node, the source of the first transistor is coupled to the drain of the second transistor, and the gate and the source of the second transistor is coupled to the second voltage node.

9. A comparator, comprising:
   input circuitry having an input signal node, a reference signal node, and an output signal node; and
   resonant tunneling diode circuitry coupled to the output signal node;
   wherein the input circuitry and the resonant tunneling diode circuitry provide at the output signal node a stable low voltage point and a stable high voltage point depending upon the level of the input signal applied to the input signal node; and
   wherein the input circuitry comprises a transistor with its gate coupled to the input signal node and its source coupled to the output signal node, and wherein the resonant tunneling diode circuitry comprises a resonant tunneling diode coupled to the output signal node.

10. The comparator of claim 9, wherein the resonant tunneling diode has a weaker current level than the current level for the transistor.

11. Comparator circuitry, comprising:
   a plurality of comparators, each comparator comprising:
      input circuitry having an input signal node, a reference signal node, and an output signal node; and
      resonant tunneling diode circuitry coupled to the output signal node;
      wherein the input circuitry and the resonant tunneling diode circuitry provide at the output signal node a stable low voltage point and a stable high voltage point depending upon the level of the input signal applied to the input signal node;
   wherein the plurality of comparators are cascaded together such that the output signal node of a previous comparator is connected to the input signal node of the next comparator; and
   wherein the gain of the comparator circuitry is greater than one.

12. The comparator circuitry of claim 11, wherein the resonant tunneling diode circuitry for each of the comparators comprises:
   a first resonant tunneling diode coupled between the output signal node and a first voltage node; and
   a second resonant tunneling diode coupled between the output signal node and a second voltage node.

13. The comparator circuitry of claim 12, wherein the first and second resonant tunneling diodes for each comparator have a weaker current level than the current level for the input circuitry so that hysteresis is reduced.

14. The comparator circuitry of claim 13, wherein each of the comparators further comprises:
   a first transistor connected in a source-follower configuration with a gate of the first transistor being coupled to the input signal node; and
   a second transistor connected as a current sink with a gate node of the second transistor being coupled to the reference voltage node.

15. A clocked quantizer, comprising:
   an input signal node;
   an output signal node;
   comparator circuitry coupled between the input signal node and the output signal node, the comparator circuitry comprising a plurality of comparators, each comparator comprising:
      input circuitry having an input signal node, a reference signal node, and an output signal node; and
      resonant tunneling diode circuitry coupled to the output signal node; wherein the resonant tunneling diode circuitry comprises:
         a first resonant tunneling diode coupled between the output signal node and a first voltage node; and
         a second resonant tunneling diode coupled between the output signal node and a second voltage node;

wherein the input circuitry and the resonant tunneling diode circuitry provide at the output signal node a stable low voltage point and a stable high voltage point depending upon the level of the input signal applied to the input signal node; and wherein the plurality of comparators are cascaded together such that the output signal node of a previous comparator is connected to the input signal node of the next comparator; and a switch coupled between the input signal node and the comparator circuitry, the switch having a control node receiving a first clock signal;

wherein the first clock signal controls when the clock quantizer samples a signal applied to the input signal node.

16. The clocked quantizer of claim 15, further comprising a second switch coupled between the output of the comparator circuitry and the input of the comparator circuitry, the second switch receiving a second clock signal; and wherein the second control signal controls when the output signal at the output signal node is latched.

17. The clocked quantizer of claim 16, wherein the first and second clock signals are inverses of each other.

18. The clocked quantizer of claim 15, further comprising second comparator circuitry according to claim 12 coupled between the switch and the input signal node.

19. The clocked quantizer of claim 18, wherein the first comparator circuitry comprises four cascaded comparators and the second comparator circuitry comprises eight cascaded comparators.

20. A clocked quantizer, comprising:
an input signal node;
an output signal node;
comparator circuitry coupled between the input signal node and the output signal node, the comparator circuitry comprising a plurality of comparators, each comparator comprising:
input circuitry having an input signal node, a reference signal node, and an output signal node; and
resonant tunneling diode circuitry coupled to the output signal node;
wherein the input circuitry and the resonant tunneling diode circuitry provide at the output signal node a stable low voltage point and a stable high voltage point depending upon the level of the input signal applied to the input signal node;
wherein the plurality of comparators are cascaded together such that the output signal node of a previous comparator is connected to the input signal node of the next comparator; and
a switch coupled between the input signal node and the comparator circuitry, the switch having a control node receiving a first clock signal;
wherein the first clock signal controls when the clock quantizer samples a signal applied to the input signal node; and
wherein the gain of the comparator circuitry is greater than one.

21. The clocked quantizer of claim 20, wherein the resonant tunneling diode circuitry for each of the cascaded comparators comprises:
a first resonant tunneling diode coupled between the output signal node and a first voltage node; and
a second resonant tunneling diode coupled between the output signal node and a second voltage node.

22. The clocked quantizer of claim 21, wherein the first and second resonant tunneling diodes for each comparator have a weaker current level than the current level for the input circuitry so that hysteresis is reduced.

23. The clocked quantizer of claim 22, wherein each of the comparators further comprises:
a first transistor connected in a source-follower configuration with a gate of the first transistor being coupled to the input signal node; and
a second transistor connected as a current sink with a gate node of the second transistor being coupled to the reference voltage node.

24. A method for providing a low level or a high level indication based upon the level on an input signal, comprising:
receiving an input signal;
driving the input signal with input circuitry to produce an output signal;
utilizing resonant tunneling diode circuitry to produce for the output signal a stable low voltage point or a stable high voltage point depending upon the level of the input signal;
wherein the resonant tunneling diode circuitry comprises:
a first resonant tunneling diode coupled between the output signal node and a first voltage node; and
a second resonant tunneling diode coupled between the output signal node and a second voltage node.

25. The method of claim 24, wherein the resonant tunneling diode circuitry has a weaker current level than the current level for the input circuitry so that hysteresis is reduced.

26. The method of claim 24, wherein the current levels for the first and second resonant tunneling diodes are at least about 10 times less than the current level for the input circuitry.

27. The method of claim 24, wherein the input circuitry provides an output signal that follows the input signal.

28. A method for providing a low level or a high level indication based upon the level on an input signal, comprising:
receiving an input signal;
driving the input signal with input circuitry to produce an output signal;
utilizing resonant tunneling diode circuitry to produce for the output signal a stable low voltage point or a stable high voltage point depending upon the level of the input signal; and
providing an overall gain that is greater than one;
wherein the driving and utilizing steps are repeated a plurality of times by cascading together a plurality of comparators, with each comparator comprising the input circuitry and the resonant tunneling diode circuitry.

29. The method of claim 28, wherein the resonant tunneling diode circuitry for each comparator has a weaker current level than the current level for the input circuitry so that hysteresis is reduced.

30. The method of claim 28, further comprising after the receiving step, controlling when the input signal is provided to the plurality of comparators so that the input signal is sampled at a desired rate.

* * * * *

UNITED STATES PATENT AND TRADEMARK OFFICE
CERTIFICATE OF CORRECTION

PATENT NO.      : 6,456,214 B1
DATED           : September 24, 2002
INVENTOR(S)     : J. Paul A. van der Wagt It is certified that error appears in the above-identified patent and that said Letters Patent is hereby corrected as shown below:

Column 1,
Line 4, please insert:

-- Government Rights

This invention was made with Government support under Contract No. N66001-96-C-8620. The Government has certain rights in this invention --

Signed and Sealed this

Fifteenth Day of July, 2003

JAMES E. ROGAN
*Director of the United States Patent and Trademark Office*